United States Patent
Wu et al.

(10) Patent No.: US 7,374,259 B2
(45) Date of Patent: May 20, 2008

(54) DETACHABLE CASE ASSEMBLY FOR COMPUTER SERVER

(75) Inventors: Chia-Kang Wu, Taipei (TW); Yu-Jen Liang, Taipei (TW); Fu-Jung Hsui, Taipei (TW)

(73) Assignee: Tatung Co., Ltd., Taipei (TW)

( * ) Notice: Subject to any disclaimer, the term of this patent is extended or adjusted under 35 U.S.C. 154(b) by 509 days.

(21) Appl. No.: 11/197,448

(22) Filed: Aug. 5, 2005

(65) Prior Publication Data

US 2006/0039121 A1 Feb. 23, 2006

(30) Foreign Application Priority Data

Aug. 23, 2004 (TW) ............................... 93213402 U

(51) Int. Cl.
*G06F 1/16* (2006.01)
(52) U.S. Cl. .................... 312/223.2; 361/679; 361/724
(58) Field of Classification Search ................ 361/679, 361/683–685, 724; 312/223.1, 223.2
See application file for complete search history.

(56) References Cited

U.S. PATENT DOCUMENTS

| | | | | |
|---|---|---|---|---|
| 5,398,161 A | * | 3/1995 | Roy ........................... 361/727 |
| 6,129,429 A | * | 10/2000 | Hardt et al. .............. 312/223.2 |
| 6,198,633 B1 | * | 3/2001 | Lehman et al. ............. 361/756 |
| 6,704,196 B1 | * | 3/2004 | Rodriguez et al. .......... 361/687 |
| 6,856,508 B2 | * | 2/2005 | Rabinovitz ................... 361/685 |
| 6,999,319 B2 | * | 2/2006 | Wu et al. ..................... 361/724 |
| 2005/0104486 A1 | * | 5/2005 | Huang et al. ............. 312/223.2 |
| 2005/0135060 A1 | * | 6/2005 | Cote et al. ................... 361/695 |

* cited by examiner

*Primary Examiner*—Jayprakash N Gandhi
*Assistant Examiner*—Anthony Q Edwards
(74) *Attorney, Agent, or Firm*—Bacon & Thomas, PLLC

(57) ABSTRACT

A detachable case assembly is disclosed to include a case body, which has front and rear angled slots, a partition plate, which separates the case body into a front and a rear holding space, a front cover, which covers the front half of the top side of the case body and which has locating rods for engaging into the front angled slots of the case body and a rear edge supported on the protruded bearing portions of the partition plate, and a rear cover, which covers the rear half of the top side of the case body and which has locating rods for engaging into the rear angled slots of the case body, a front flange supported on the partition plate and spaced below the rear edge of the front cover, raised contact portions maintained in close contact with the rear edge of the front cover.

4 Claims, 5 Drawing Sheets

DETACHABLE CASE ASSEMBLY FOR COMPUTER SERVER

BACKGROUND OF THE INVENTION

1. Field of the Invention

The present invention relates to a computer server and more particularly, to a detachable case assembly for computer server, which comprises a front cover and a rear cover respectively detachably covered on the front and rear halves of the top side of the case body thereof.

2. Description of Related Art

Different firms for the advantage of standardized machine size convenient for management in a machine room to fully utilize the limited floor space of the machine room popularly accept computer servers.

A regular computer server has many parts on the inside and a big horizontal area. Conventional computer servers commonly have two covers, namely, the front cover and the rear cover that have the outer part of the computer server well packed and maintain sufficient rigidity of the case.

However, the front and rear covers of a conventional computer server are not separately detachable, i.e., both the front and rear covers must be removed from the case of the computer server when wishing to repair component parts in the front or rear part of the inside space of the computer server's case. This inconvenience design complicates maintenance work.

SUMMARY OF THE INVENTION

The present invention has been accomplished under the circumstances in view. It is therefore the main object of the present invention to provide a detachable case assembly for computer server, which enables the user to detach the front or rear cover separately to facilitate maintenance work. It is another object of the present invention to provide a detachable case assembly for computer server, which is easy to install and can maintain the stability of the structure with the use of a limited number of screws.

To achieve these and other objects of the present invention, the detachable case assembly is comprised of a case body, a partition plate, a front cover, and a rear cover. The case body comprises a top panel, two side panels, and a back panel. The top panel is fixedly mounted between the two side panels at a front-top side thereof. The two side panels each have a plurality of first angled slots provided at the front-top side, and a plurality of second angled slots provided at a rear-top side thereof. The first angled slots each have a vertical slot portion and a horizontal slot portion perpendicularly backwardly extended from a bottom end of the vertical slot portion of the first angle slot. The second angled slots each have a vertical slot portion and a horizontal slot portion perpendicularly forwardly extended from a bottom end of the vertical slot portion of the second angled slot. The back panel has a plurality of screw holes in a top side thereof. The partition plate is transversely mounted inside the case body and separating an inside space of the case body into a front holding space and a rear holding space. The partition plate comprises a top mounting flange, which has a plurality of upwardly protruded bearing portions and a plurality of downwards recessed retaining portions. The rear cover comprises a rear cover body, a front flange, two opposite side flanges, and a rear flange. The front flange of the rear cover is forwardly extended from a front side of the rear cover body at an elevation lower than the rear cover body. The front flange of the rear cover has a plurality of front notches respectively engageable to the upwardly protruded bearing portions of the partition plate. The two side flanges of the rear cover each comprise a plurality of locating rods inserted into the vertical slot portions of the second angled slots of the case body and then engaged into the horizontal slot portions of the second angle slots of the case body when moving forwardly, the rear flange having a plurality of through holes respectively corresponding to the plurality of screw holes in the back panel of the case body. The front cover comprises a front cover body having a front edge and a rear edge, and two opposite side flanges. The front cover body of the front cover comprises a plurality of first protruding retaining devices at the front edge that engage to a front edge of the top panel of the case body, and a plurality of second protruding retaining devices at the rear edge that engage to the downwards recessed retaining portions of the top mounting flange of the partition plate. The two side flanges of the front cover each have a plurality of locating rods respectively inserted into the vertical slot portions of the first angled slots of the case body and then engaged into the horizontal slot portions of the first angle slots of the case body when moving backwardly. Wherein, the front cover and the rear cover being respectively covered in the front holding space and the rear holding space of the case body, when the rear edge of the front cover being supported on the protruded bearing portions of the partition plate and spaced by the protruded bearing portions above the top mounting flange of the partition plate and the front flange of the rear cover.

In addition, the front cover and the rear cover are respectively covered on the front and rear part of the top side of the case body; the rear edge of the front cover and the front flange of the rear cover are suspended above the top flange of the partition plate at different elevations; the rear edge of the front cover is supported on the bearing portions of the partition plate and spaced by the bearing portions above the top flange of the partition plate and the front flange of the rear cover. Therefore, the front cover and the rear cover can be separately and rapidly mounted on or dismounted from the case body of the detachable case assembly, and the desired stability of the detachable case assembly can be achieved simply by using two screws.

DETAILED DESCRIPTION OF THE PREFERRED EMBODIMENT

Figure 1:
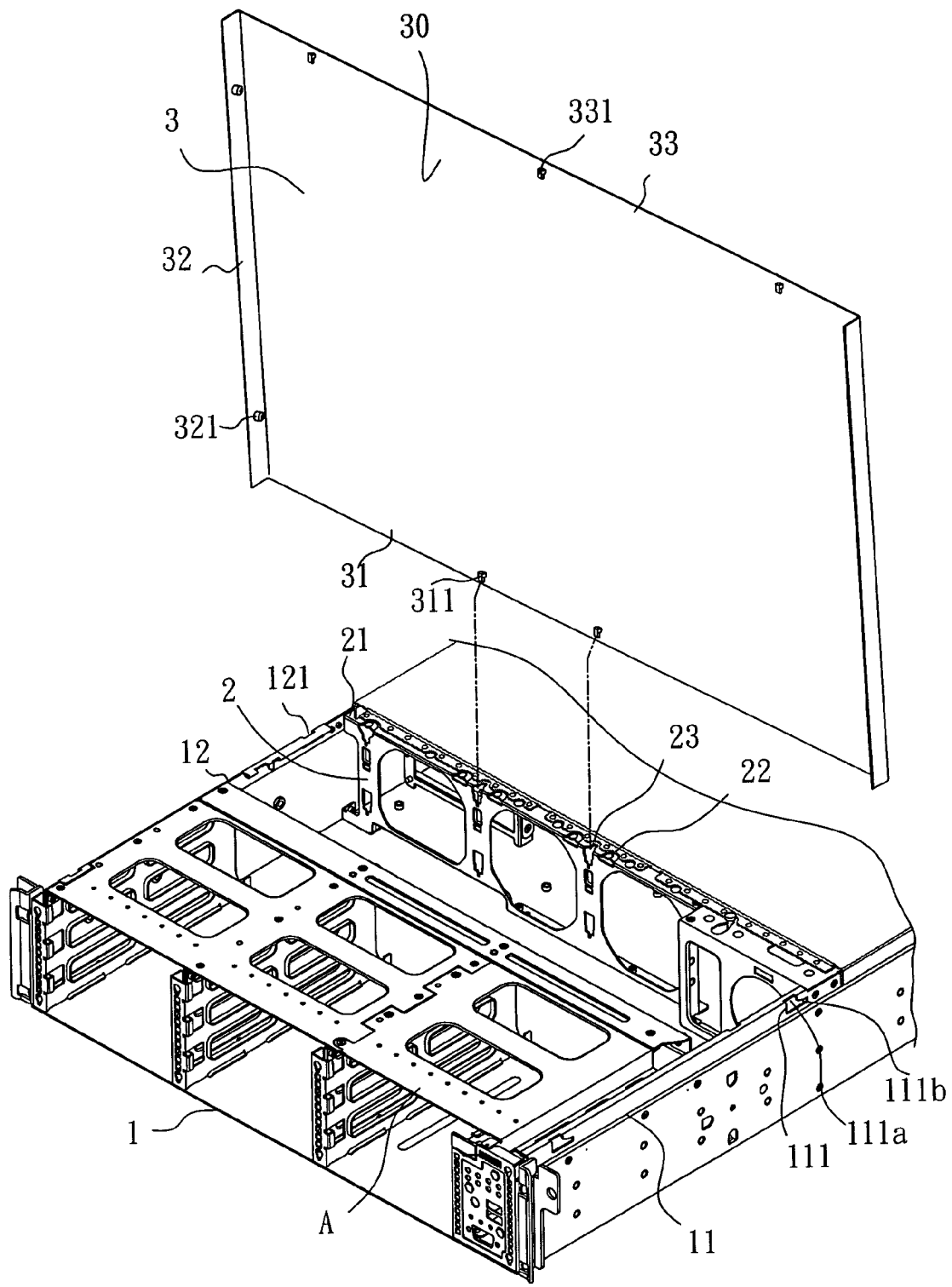
FIG. 1 is an exploded view of a front part of a detachable case assembly according to the present invention.

Referring to FIG. 1, a detachable case assembly for computer server in accordance with the present invention is shown comprised of a case body 1, a partition plate 2, and a front cover 3.

Figure 3:
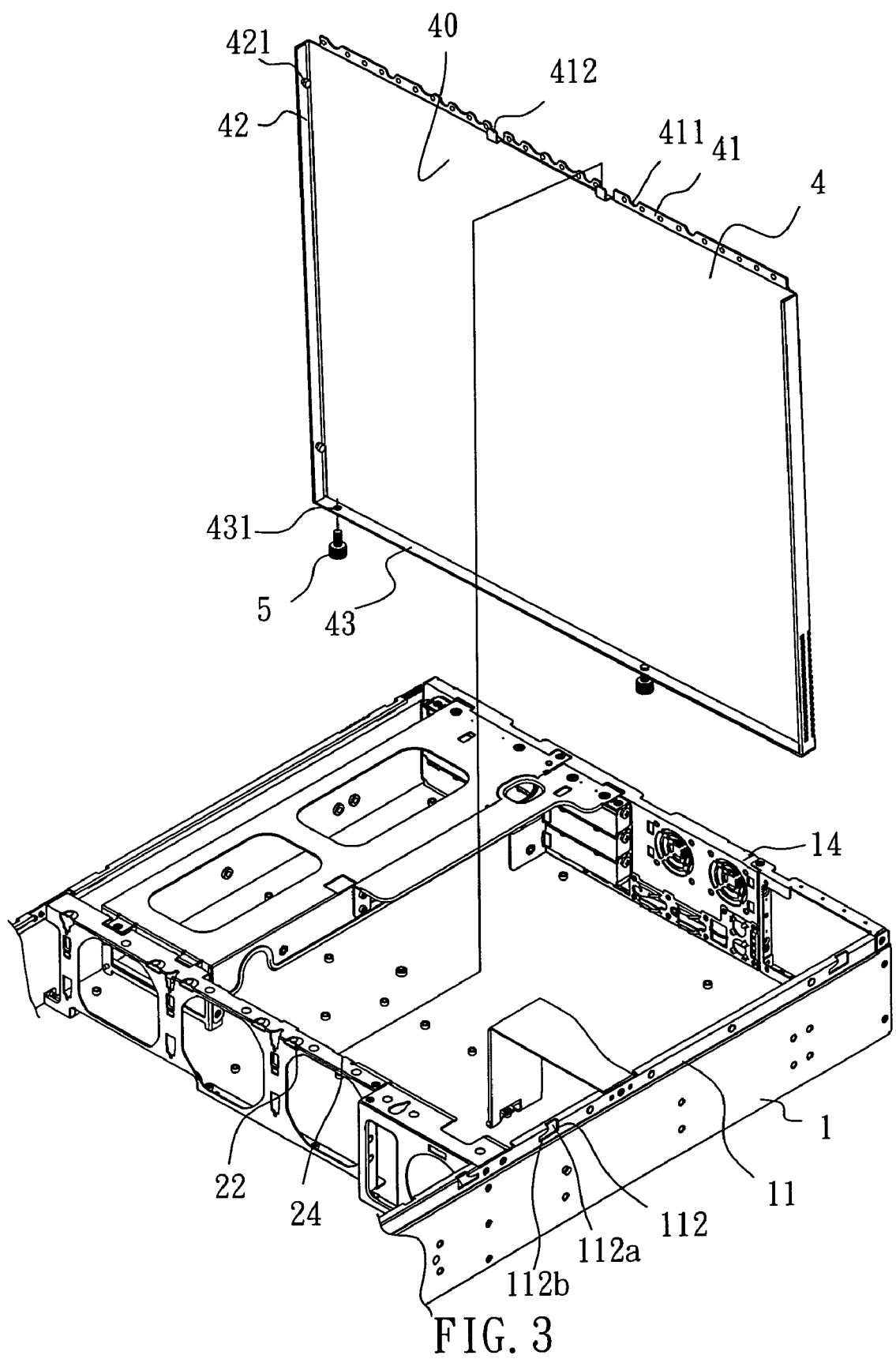
FIG. 3 is an exploded view of the rear part of the detachable case assembly according to the present invention.
Figure 4:
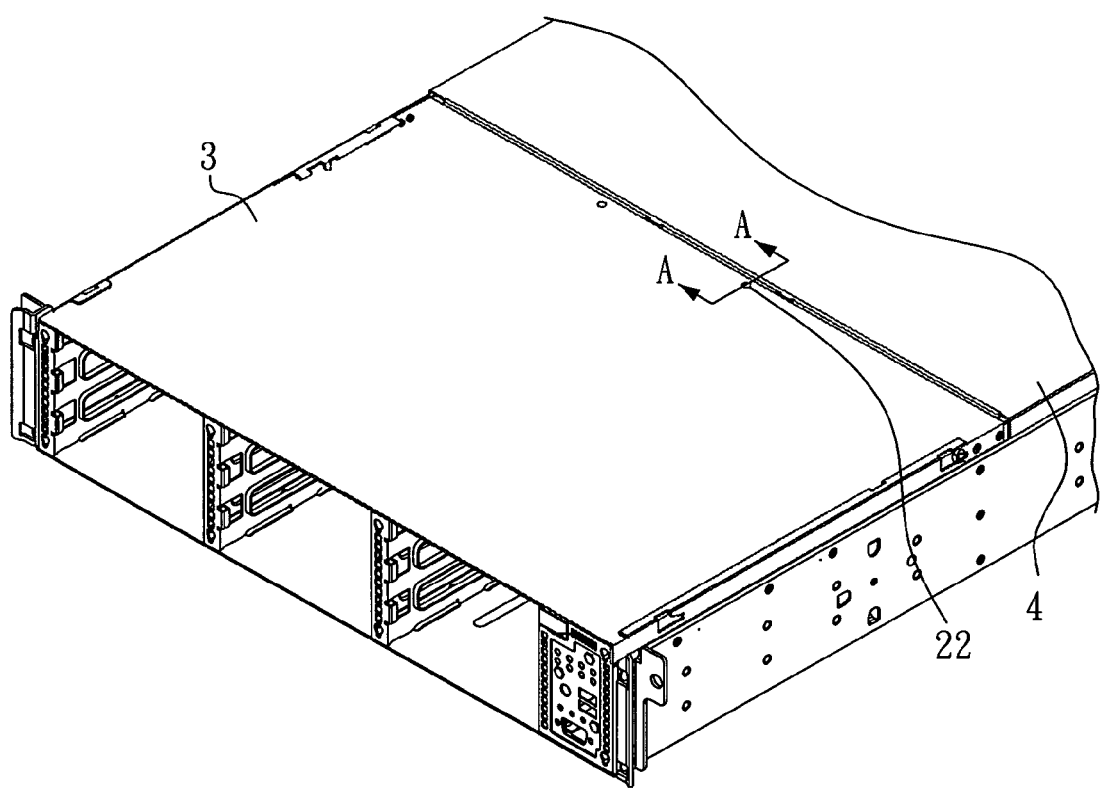
FIG. 4 is an elevational assembly view of a part of the detachable case assembly according to the present invention.
Figure 5:
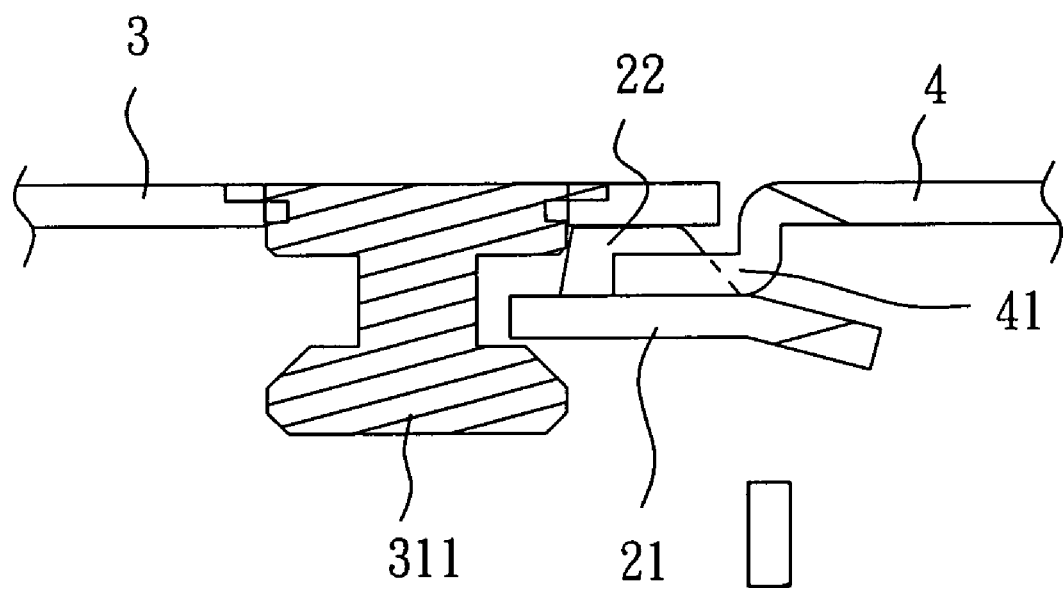
FIG. 5 is a sectional view in an enlarged scale taken along line A-A of FIG. 4.

The case body 1 comprises a top panel 13, two side panels 11 and 12, and a back panel 14 (not shown; see FIG. 3). The top panel 13 covers the top side of the front part of the case body 1. The two side panels 11 and 12 each have two angled slots 111 or 121 at the respective front half. Each angled slot 111 or 121 comprises a vertical slot portion 111a and a horizontal slot portion 111b perpendicularly backwardly extended from the bottom end of the vertical slot portion 111a.

The partition plate 2 is transversely mounted inside the case body 1 on the middle, having a top mounting flange 21. The top mounting flange 21 has a plurality of bearing portions 22 protruding over the top surface, a plurality of recessed retaining portions 23, and two plugholes 24 (not shown; see FIG. 3).

The front cover 3 comprises a cover body 30, a front edge 33, two opposite side flanges 32, and a rear edge 31. The cover body 30 comprises two first protruding retaining devices 331 disposed adjacent to the front edge 33 corresponding to the top panel 13 of the case body 1, and three second protruding retaining devices 311 disposed adjacent to the rear edge 31 corresponding to the recessed retaining portions 23 of the top mounting flange 21 of the partition plate 2. The side flanges 32 each have two locating rods 321 perpendicularly suspended on the inner side corresponding to the angled slots 111 and 121 of the side panels 11 and 12 of the case body 1. During installation, the locating rods 321 of the front cover 3 are respectively inserted into the angled slots 111 and 121 of the side panels 11 and 12 of the case body 1, and then the front cover 3 is moved backwards relative to the case body 1 to force the first protruding retaining devices 331 into engagement with the top panel 13 of the case body 1 and the second protruding retaining devices 311 into engagement with the recessed retaining portions 23 of the top mounting flange 21 of the partition plate 2. When installed, the upwardly protruded bearing portions 22 forces the cover body 30 of the front cover 3 upwards, thereby enhancing the engagement between the locating rods 321 and the angled slots 111 and 121. The first protruding retaining devices 331 and the second protruding retaining devices 311 may be variously embodied. According to this embodiment, the first protruding retaining devices 331 are T-shaped hooks; the second protruding retaining devices 311 are I-shaped retaining rods.

Figure 2:
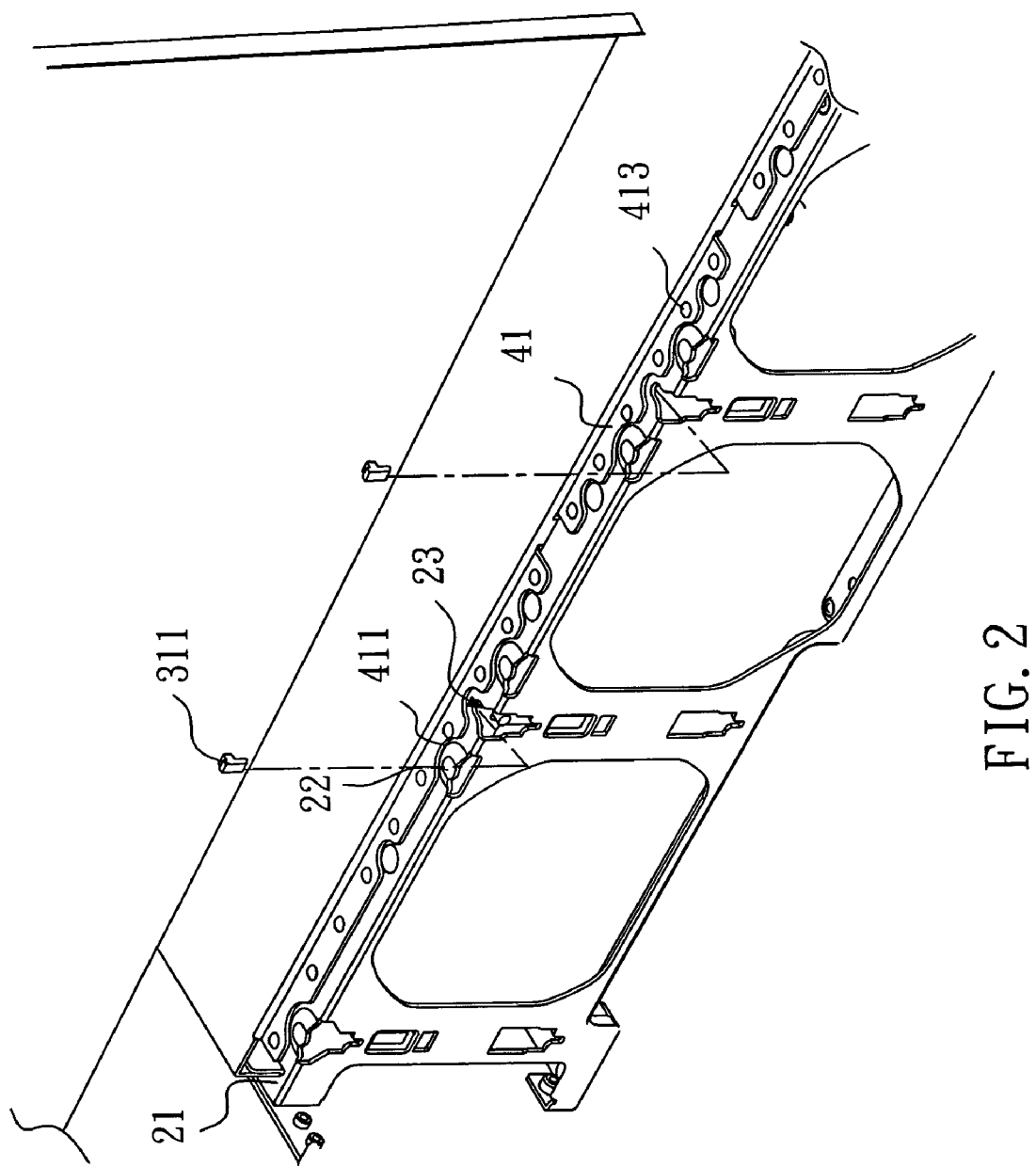
FIG. 2 is an enlarged view of a part of FIG. 1, showing the structure of the partition plate.

FIG. 2 is an enlarged view of a part of the present invention. From FIG. 2, we can see clearly the structure of the bearing portions 22 and recessed retaining portions 23 of the partition plate 2.

Referring to FIG. 3, the detachable case assembly of the present invention further comprises a rear cover 4. Further, the two side panels 11 and 12 of the case body 1 each have two angled slots 112 or 122 at the respective rear half. Each angled slot 112 or 122 comprises a vertical slot portion 112a and a horizontal slot portion 112b perpendicularly forwardly extended from the bottom end of the vertical slot portion 112a. Further, the rear cover 4 has two screw holes 141 (not shown).

The rear cover 4 comprises a cover body 40, a front flange 41, two opposite side flanges 42, and a rear flange 43. The horizontal elevation of the front flange 41 is lower than the cover body 40 of the rear cover 4 (see also FIG. 2). The front flange 41 has a plurality of front notches 411 corresponding to the upwardly protruded bearing portions 22 of the partition plate 2, a plurality of raised contact portions 413 (see FIG. 2), and two plug rods 412 corresponding to the plugholes 24 of the partition plate 2. The side flanges 42 each have two locating rods 421 perpendicularly suspended on the inner side corresponding to the angled slots 112 and 122 of the side panels 11 and 12 of the case body 1. The rear flange 43 has two through holes 431 corresponding to the screw holes 141 of the back panel 14.

During installation, the locating rods 421 of the rear cover 4 are respectively inserted into the angled slots 112 and 122 of the side panels 11 and 12 of the case body 1, and then the rear cover 4 is moved forwards relative to the case body 1 to force the plug rods 412 into the plugholes 24 of the partition plate 2 and further force the front notches 411 into engagement with the upwardly protruded bearing portions 22 of the partition plate 2, and then screws 5 are respectively mounted in the through holes 431 of the rear cover 4 and threaded into the screw holes 141 of the back panel 14 to affix the rear cover 4 to the case body 1.

Referring to FIGS. 4 and 5 and FIGS. 1~3 again, the front cover 3 and the rear cover 4 are respectively covered on the front and rear part of the top side of the case body 1. Further, the rear edge 31 of the front cover 3 and the front flange 41 of the rear cover 4 are suspended above the top flange 2 of the partition plate 2 at different elevations; the rear edge 31 of the front cover 3 is supported on the bearing portions 22 and spaced by the bearing portions 22 above the top flange 21 of the partition plate 2 and the front flange 41 of the rear cover 4. Further, the raised contact portions 413 of the rear cover 4 are maintained in close contact with the rear edge 31 of the front cover 3 to prevent discharge of electromagnetic waves out of the computer server. According to the present invention, the front cover and the rear cover can be separately and rapidly mounted on or dismounted from the case body of the detachable case assembly, and the desired stability of the detachable case assembly can be achieved simply by using two screws.

Although the present invention has been explained in relation to its preferred embodiment, it is to be understood that many other possible modifications and variations can be made without departing from the spirit and scope of the invention as hereinafter claimed.

What is claimed is:

1. A detachable case assembly comprising:
    a case body, said case body comprising a top panel, two side panels, and a back panel, said top panel being fixedly mounted between said two side panels at a front-top side thereof, said two side panels each having a plurality of first angled slots provided at said front-top side, and a plurality of second angled slots provided at a rear-top side thereof, said first angled slots each having a vertical slot portion and a horizontal slot portion perpendicularly backwardly extended from a bottom end of said vertical slot portion of said first angled slot, said second angled slots each having a vertical slot portion and a horizontal slot portion perpendicularly forwardly extended from a bottom end of said vertical slot portion of said second angled slot, said back panel having a plurality of screw holes in a top side thereof;
    a partition plate transversely mounted inside said case body and separating an inside space of said case body into a front holding space and a rear holding space, said partition plate having a top mounting flange, said top mounting flange having a plurality of upwardly protruded bearing portions and a plurality of downwards recessed retaining portions;
    a rear cover, said rear cover comprising a rear cover body, a front flange, two opposite side flanges, and a rear flange, the front flange of said rear cover forwardly extended from a front side of the rear cover body at an elevation lower than the rear cover body, the front flange of said rear cover having a plurality of front notches respectively engageable to the upwardly protruded bearing portions of said partition plate, the two side flanges each comprising a plurality of locating rods insertable into the vertical slot portions of said second angled slots of said case body and engageable into the horizontal slot portions of said second angle slots of said case body when moving forwardly, the rear flange having a plurality of through holes respectively corresponding to the plurality of screw holes in the back panel of said case body; and a front cover, said front cover comprising a front cover body having a front edge and a rear edge, and two opposite side flanges, the front cover body comprising a plurality of first protruding retaining devices at said front edge adapted to engage to a front edge of the top panel of said case body, and a plurality of second protruding retaining devices at said rear edge adapted to engage to the downwards recessed retaining portions of the top mounting flange of said partition plate, the two side flanges of said front cover each having a plurality of locating rods insertable into the vertical slot portions of said first angled slots of said case body and engageable into the horizontal slot portions of said first angle slots of said case body when moving backwardly;

wherein, the front cover and the rear cover being respectively covered in the front holding space and the rear holding space of the case body, when the rear edge of the front cover being supported on the protruded bearing portions of said partition plate and spaced by the protruded bearing portions above the top mounting flange of the partition plate and the front flange of the rear cover.

2. The detachable case assembly as claimed in claim 1, wherein said first protruding retaining devices of said front cover are T-shaped hooks; said second protruding retaining devices of said front cover are I-shaped retaining rods.

3. The detachable case assembly as claimed in claim 1, wherein said top mounting flange of said partition plate further comprises a plurality of plugholes; said rear cover further comprises a plurality of plugs respectively extended from the front flange thereof and respectively plugged into said plugholes of said top mounting flange of said partition plate.

4. The detachable case assembly as claimed in claim 1, wherein said rear cover further comprises a plurality of raised contact portions upwardly protruded from the front flange thereof and maintained in close contact with the rear edge of said front cover.

\* \* \* \* \*